United States Patent
Miyake (10) Patent No.: US 9,887,222 B2
(45) Date of Patent: Feb. 6, 2018

(54) METHOD OF MANUFACTURING OPTICAL APPARATUS

(71) Applicant: CANON KABUSHIKI KAISHA, Tokyo (JP)

(72) Inventor: Takashi Miyake, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/388,597

(22) Filed: Dec. 22, 2016

(65) Prior Publication Data

US 2017/0104023 A1 Apr. 13, 2017

Related U.S. Application Data

(63) Continuation of application No. 14/444,121, filed on Jul. 28, 2014, now Pat. No. 9,570,632.

(30) Foreign Application Priority Data

Aug. 21, 2013 (JP) ................................. 2013-171712

(51) Int. Cl.
*H01L 27/146* (2006.01)
*H01L 31/0203* (2014.01)

(52) U.S. Cl.
CPC .. *H01L 27/14618* (2013.01); *H01L 27/14632* (2013.01); *H01L 27/14687* (2013.01); *H01L 27/14698* (2013.01); *H01L 31/0203* (2013.01)

(58) Field of Classification Search
CPC ........... H01L 27/14618; H01L 31/0203; H01L 2224/45144; H01L 2224/48091; H01L 2224/48227; H01L 2924/3511; H01L 2924/00014; H01L 2924/00;
(Continued)

(56) References Cited

U.S. PATENT DOCUMENTS

| 6,383,835 B1 | 5/2002 | Hata et al. |
| 6,388,339 B1 | 5/2002 | Yamamoto et al. |
| 6,774,481 B2 | 8/2004 | Ono |

(Continued)

FOREIGN PATENT DOCUMENTS

| CN | 1199253 C | 4/2005 |
| CN | 101103448 A | 1/2008 |

(Continued)

OTHER PUBLICATIONS

First Office Action in Chinese Application No. 201410404024.3 (dated Feb. 25, 2016).

(Continued)

*Primary Examiner* — Thanh T Nguyen
(74) *Attorney, Agent, or Firm* — Fitzpatrick, Cella, Harper & Scinto (57) ABSTRACT

A method of manufacturing an optical apparatus is provided. The method includes arranging a photo device above a substrate with an adhesive located between the photo device and the substrate, forming a bonding member that bonds the substrate and the photo device by curing the adhesive, and arranging, above the photo device, a transparent plate and a sealing member. The sealing member covers the photo device and is located between the transparent plate and the substrate. An elastic modulus of the bonding member is 1 GPa or less.

20 Claims, 3 Drawing Sheets

(58) Field of Classification Search
CPC ......... H01L 27/14632; H01L 27/14687; H01L 27/14698
See application file for complete search history.

(56) References Cited

U.S. PATENT DOCUMENTS

| | | | |
|---|---|---|---|
| 6,800,373 | B2 | 10/2004 | Gorczyca |
| 8,236,614 | B2 | 8/2012 | Misumi et al. |
| 8,928,803 | B2 | 1/2015 | Shimizu |
| 9,570,632 | B2* | 2/2017 | Miyake ............... H01L 31/0203 438/67 |
| 2002/0053742 | A1 | 5/2002 | Hata et al. |
| 2003/0020178 | A1 | 1/2003 | Ohashi et al. |
| 2003/0132701 | A1 | 7/2003 | Sato et al. |
| 2010/0193240 | A1 | 8/2010 | Takayama |
| 2010/0225230 | A1 | 9/2010 | Hsin |
| 2012/0189845 | A1 | 7/2012 | Misumi et al. |
| 2014/0312503 | A1 | 10/2014 | Seo |

FOREIGN PATENT DOCUMENTS

| | | |
|---|---|---|
| JP | 9-129780 A | 5/1997 |
| JP | 11-340480 A | 12/1999 |
| JP | 2002-076313 A | 3/2002 |
| JP | 2004-277697 A | 10/2004 |
| JP | 2007-324360 A | 12/2007 |
| JP | 2012-253282 A | 12/2012 |
| JP | 2013-118230 A | 6/2013 |
| WO | 2009/145939 A1 | 12/2009 |
| WO | 2012/169497 A1 | 12/2012 |

OTHER PUBLICATIONS

Second Office Action in Chinese Application No. 201410404024.3 (dated Oct. 9, 2016).

Notification of Reasons for Refusal (Final) in Japanese Application No. 2013-171712 (dated Nov. 6, 2017).

* cited by examiner

METHOD OF MANUFACTURING OPTICAL APPARATUS

CROSS-REFERENCE TO RELATED APPLICATIONS

This application is a continuation of U.S. patent application Ser. No. 14/444,121, filed Jul. 28, 2014, which claims the benefit of Japanese Patent Application No. 2013-171712, filed Aug. 21, 2013. The entire contents of these prior applications are incorporated herein by reference.

BACKGROUND OF THE INVENTION

Field of the Invention

The present invention relates to an optical apparatus and a method of manufacturing the same.

Description of the Related Art

Japanese Patent Laid-Open No. 9-129780 proposes a method of manufacturing an IC package (optical apparatus) in which a photo sensor IC chip is fixed on a printed board and covered with a transparent resin, and the transparent resin is covered with an optically transparent member such as a glass member.

SUMMARY OF THE INVENTION

In the manufacturing method of Japanese Patent Laid-Open No. 9-129780, the transparent plate such as a glass plate located on the photo sensor may warp due to a force generated by the substrate, transparent resin, or the like during the manufacture of the optical apparatus. This warping degrades the performance of the optical apparatus. An aspect of the present invention provides a technique for suppressing warping that occurs in the transparent plate of an optical apparatus.

According to an aspect of the present invention, provided is a method of manufacturing an optical apparatus, comprising: arranging a photo device above a substrate with an adhesive located between the photo device and the substrate; forming a bonding member that bonds the substrate and the photo device by curing the adhesive; and arranging, above the photo device, a transparent plate and a sealing member, the sealing member covering the photo device and located between the transparent plate and the substrate, wherein an elastic modulus of the bonding member is 1 GPa or less.

According to another aspect of the present invention, provided is an optical apparatus comprising: a substrate; a photo device fixed to the substrate by a bonding member; a transparent plate located above the photo device; and a sealing member that is located between the transparent plate and the substrate and covers the photo device, wherein an elastic modulus of the bonding member is 1 GPa or less.

Further features of the present invention will become apparent from the following description of exemplary embodiments (with reference to the attached drawings).

DESCRIPTION OF THE EMBODIMENTS

Preferred embodiments of the present invention will now be described with reference to the accompanying drawings. The same reference numerals denote the same elements throughout various embodiments, and a repetitive description thereof will be omitted. The embodiments can appropriately be modified or combined.

The structure of an optical apparatus 100 according to some embodiments will be described with reference to the schematic sectional view of FIG. 1. The optical apparatus 100 includes components shown in FIG. 1. In the following description, the upper portion of the drawing will be referred to as the upper side of each component, and the lower portion of the drawing will be referred to as the lower side of each. The optical apparatus 100 is mounted on, for example, an image capturing apparatus such as a camera. A photo device 110 is, for example, a photo sensor that generates an electrical signal by photoelectric conversion based on light that has entered the optical apparatus 100 and reached a light-receiving surface 111 of the photo device 110. The photo device 110 can have any structure, for example, an existing structure, and a detailed description thereof will be omitted. The photo device 110 may be, for example, an autofocus sensor that measures the distance to the light source based on the positional relationship between photodiodes located at the focal points of light divided into two parts by spectacle lenses. Alternatively, the photo device 110 may be an image sensor that generates image data using a plurality of pixels arranged on an array. The photo device 110 may be a display device.

The photo device 110 is fixed on the upper surface of a substrate 120 by a bonding member 130. For example, the bonding member 130 is a resin. For example, the bonding member 130 is formed by curing a liquid adhesive arranged between the photo device 110 and the substrate 120. The substrate 120 has terminals 121 extending through it. Each terminal 121 includes an inner portion 121a located on the upper surface of the substrate 120, an outer portion 121b located on the lower surface of the substrate 120, and a connection portion 121c located in a through hole formed in the substrate 120 and connecting the inner portion 121a and the outer portion 121b. The terminals 121 are made of, for example, a conductor such as a metal. The inner portion 121a of each terminal 121 and a terminal of the photo device 110 are connected by a bonding wire 140 such as a fine metal line. The outer portion 121b of the terminal 121 is a portion to be mounted on a wiring board via, for example, solder and thus used to connect another device. Another device and the photo device 110 are electrically connected via the terminals 121 and the bonding wires 140. The substrate 120 and the terminals 121 form a connection member used to support the photo device 110 and electrically connect the photo device 110 to another device.

The photo device 110, the inner portions 121a of the terminals 121, and the upper surfaces of the substrate 120 are covered with a transparent sealing member 160. A transparent plate 150 configured to cover and protect the photo device 110 is arranged on the sealing member 160. The side surfaces of the substrate 120, the side surfaces of the sealing member 160, and the side surfaces of the transparent plate 150 are flush with each other. The transparent plate 150 is made of, for example, glass. The sealing member 160 is made of, for example, a resin.

Figure 2A:
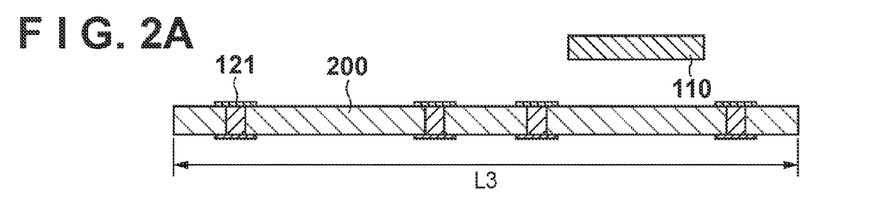
FIGS. 2A to 2F are schematic sectional views for explaining an example of a method of manufacturing the optical apparatus according to some embodiments.

An example of a method of manufacturing an optical apparatus 100 will be described next with reference to FIGS. 2A to 2F. FIGS. 2A to 2F are schematic sectional views showing steps in the manufacture of the optical apparatus 100. First, as shown in FIG. 2A, a photo device 110 and a substrate 200 having terminals 121 are prepared. In this step, a plurality of photo devices 110 may be prepared. For example, the photo devices 110 are prepared by manufacturing them from a silicon wafer by a semiconductor process and dividing the wafer by dicing. The terminals 121 may be arranged in the substrate 200 in correspondence with each of the plurality of photo devices 110. The plurality of terminals 121 are arranged in, for example, a matrix in the substrate 200.

If the substrate 200 has a large size, unevenness of the distance between the photo device 110 and a transparent plate 230 (to be described later) becomes large when arranging the transparent plate 230. On the other hand, if the substrate 200 has a small size, the number of optical apparatuses 100 manufactured from one substrate decreases, resulting in an increase in cost. To prevent these, the length of each side of the upper surface of the substrate 200 prepared in this step may be 100 mm (inclusive) to 200 mm (inclusive).

Figure 2B:
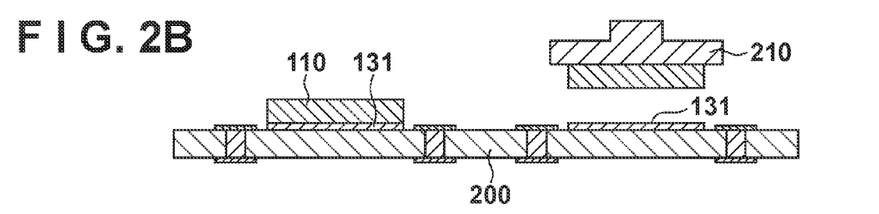

After that, as shown in FIG. 2B, each photo device 110 is arranged on the substrate 200 while inserting an adhesive 131 between them. For example, the adhesive 131 is applied onto the substrate 200 using a dispense method, printing method, or the like. The photo device 110 conveyed by a collet 210 is placed on it.

Figure 2C:
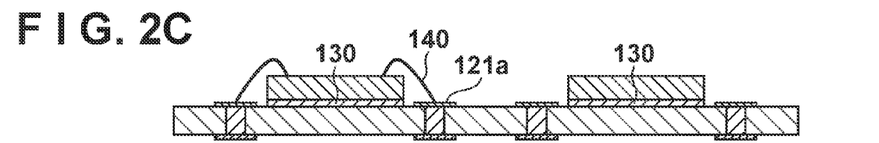

As shown in FIG. 2C, the liquid adhesive 131 is cured to form a solid bonding member 130, thereby fixing the photo device 110 on the substrate 200. For example, when the adhesive 131 is a thermosetting resin, the adhesive 131 is heated using an oven, a reflow furnace, or the like, and cured. The thickness of the bonding member 130 is, for example, 10 to 30 μm. The thickness of the adhesive 131 to be applied is set in consideration of its cure shrinkage ratio when forming the bonding member 130. The linear expansion coefficient of the bonding member 130 is, for example, 40 to 400 ppm/° C., and for example, 150 ppm/° C.

After that, as shown in FIG. 2C, the terminals of each photo device 110 and inner portions 121a of the terminals 121 are connected by bonding wires 140. When a sealing member 160 is a resin, a gold wire may be used as the bonding wire 140. In this case, the bonding wires 140 can be prevented from being corroded by the resin. Flip chip connection may be used instead of connection by the bonding wires 140.

Figure 2D:
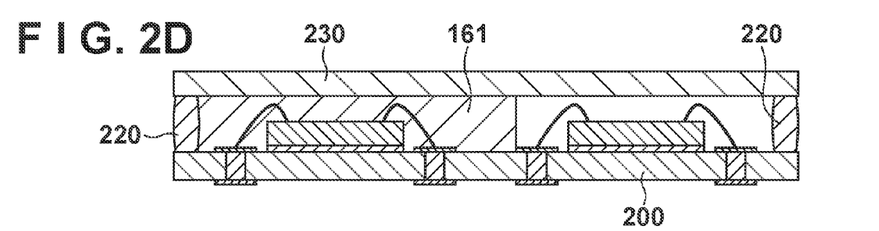

After that, as shown in FIG. 2D, a resin 220 for temporary fixing is formed near the edge of the upper surface of the substrate 200. The transparent plate 230 is arranged on the resin 220 and temporarily fixed. The viscosity of the resin 220 is set to 500 mPa·s so as to maintain the spacing between the substrate 200 and the transparent plate 230. The transparent plate 230 forms a surface serving as the light incident surface of the optical apparatus 100. When the transparent plate 230 is prepared in advance, the flatness of the light incident surface of the optical apparatus 100 can be improved. Antireflection finish such as AR coating may be applied to one surface of the transparent plate 230 to improve the sensitivity of the photo device 110. Next, the space between the substrate 200 and the transparent plate 230 is filled with a liquid sealant 161. FIG. 2D shows a state in which the sealant 161 is injected halfway between the substrate 200 and the transparent plate 230. The sealant 161 fills the space between the substrate 200 and the transparent plate 230 while contacting the substrate 200, the photo devices 110, and the transparent plate 230.

Figure 2E:
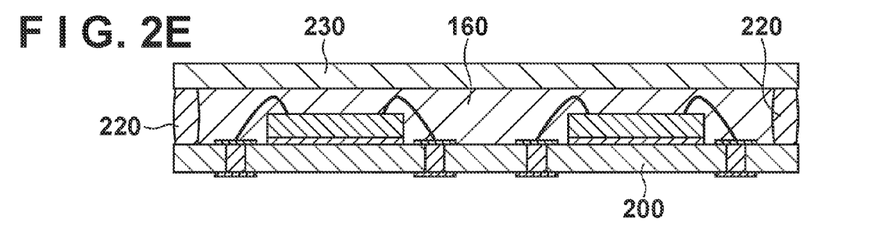

After that, as shown in FIG. 2E, the sealant 161 injected between the substrate 200 and the transparent plate 230 is cured, thereby forming the solid sealing member 160. When the photo device 110 is an autofocus sensor for a camera, a material having a transmittance of 90% or more in the visible light range may be used as the sealing member 160. From the viewpoint of optical characteristics, a resin having a high transparency and containing no filler is used as the sealing member 160. The sealant 161 is, for example, a thermosetting resin or a photo-curing resin such as an ultraviolet (UV) curing resin. Thermosetting may cause thermal expansion of the transparent plate 230 and the substrate 200 and increase the possibility of disconnection of the bonding wires 140. Hence, photo-curing may be used to cure the sealant 161. When photo-curing is used, the sealant can be cured at a low temperature even if it is heated to some extent after temporary curing. This can suppress thermal expansion of the constituent members. When a material that passes UV rays and the like for photo-curing is selected as the transparent plate 230, the sealant 161 can be cured via the transparent plate 230. In the above-described example, the sealant 161 is injected after the transparent plate 230 is arranged. However, the transparent plate 230 may be placed after the sealant 161 is applied. However, to suppress mixing of bubbles and foreign substances and increase the parallelism and spacing formation accuracy between the substrate 200 and the transparent plate 230, the sealant 161 may be injected after the transparent plate 230 is placed.

Figure 2F:
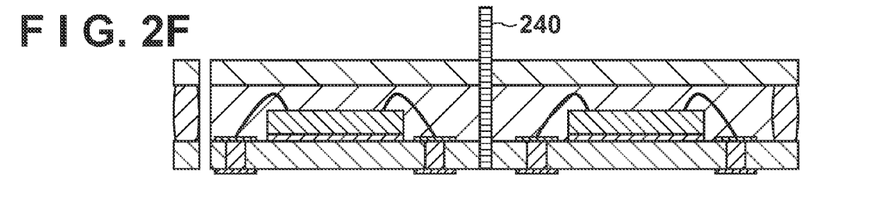

After that, as shown in FIG. 2F, the substrate 200, the sealing member 160, and the transparent plate 230 are cut for each photo device 110 using a dicing blade 240, thereby manufacturing the plurality of divided optical apparatuses 100. Individual portions of the substrate 200 after cutting become substrates 120 of the optical apparatuses 100. Individual portions of the transparent plate 230 after cutting become transparent plates 150 of the optical apparatuses 100.

Figure 3A:
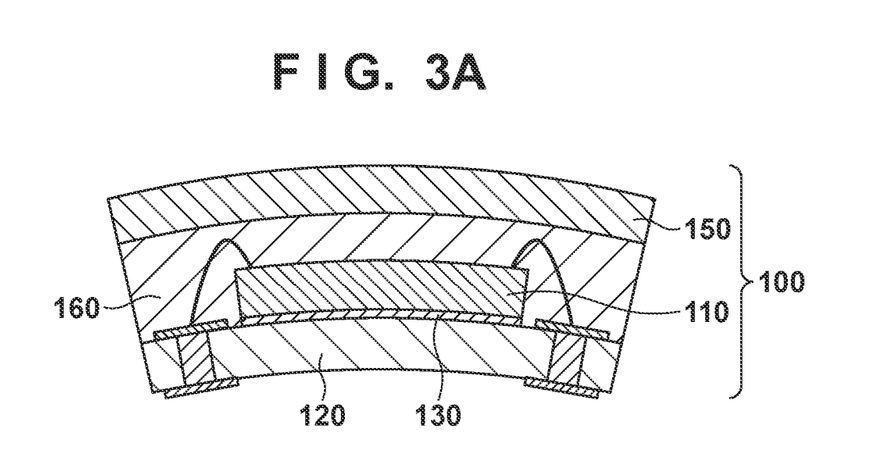
FIGS. 3A and 3B are schematic sectional views for explaining warping that occurs in the optical apparatus according to some embodiments.

Factors that warp the transparent plate 150 of the optical apparatus 100 will be described next with reference to FIGS. 3A and 3B. In the optical apparatus 100 shown in FIG. 3A, the photo device 110 and the substrate 120 warp upward due to a force acting between the photo device 110 and the substrate 120. That is, warping occurs so that the portion near the center where the photo device 110 is arranged projects upward. As a result, the transparent plate 150 warps upward as well. The force acting between the photo device 110 and the substrate 120 is generated by, for example, the difference between the linear expansion coefficient of the photo device 110 and that of the substrate 120. For example, assume that the photo device 110 and the substrate 120 both in an expanded state are bonded and then cooled. In this case, since the contraction ratio of the photo device 110 and that of the substrate 120 are different, the substance having the larger linear expansion coefficient largely contracts and warps so as to project toward the substance having the smaller linear expansion coefficient. This is a so-called bimetal effect.

Figure 3B:
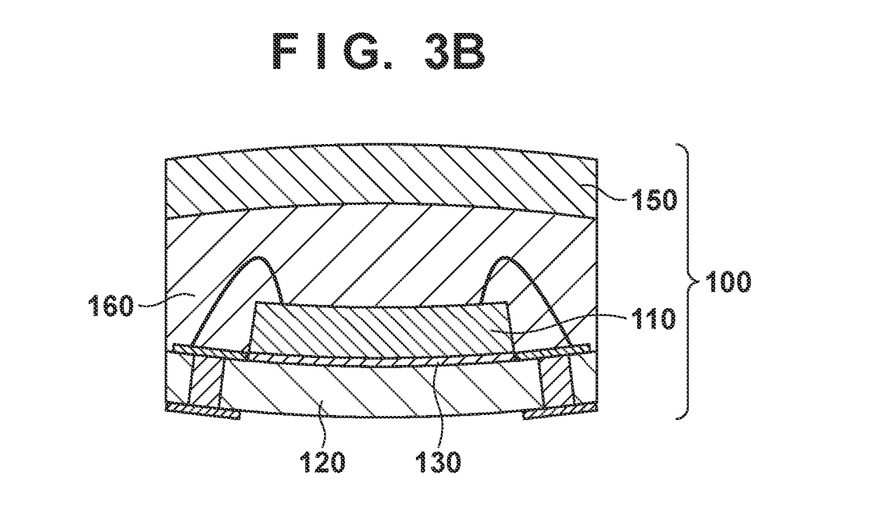

In the optical apparatus 100 shown in FIG. 3B, a force generated by volume shrinkage caused by the curing of the sealant 161 warps the transparent plate 150 upward and the photo device 110 and the substrate 120 downward. The optical apparatus 100 according to various embodiments for suppressing the warping of the transparent plate 150 caused by these factors and a method of manufacturing the same will be described below. According to the following embodiment, the magnitude of warping per mm can be 2 μm or less in a direction along the major surface of the photo device 110. If this condition is not satisfied, the magnitude of warping per 10 mm exceeds 20 μm, for example, in the direction along the major surface of the photo device 110. This can greatly deteriorate the performance of the optical apparatus 100.

In some embodiments, the bonding member 130 having a small elastic modulus is used. In the following description, the elastic modulus is defined by a Young's modulus. The unit of an elastic modulus represented by a Young's modulus is Pa, which means that the smaller the number is, the easier the material can deform. The elastic modulus (Young's modulus) can be obtained by measuring the flexure of a member (test piece) made of the same material as the bonding member 130 used in the actual optical apparatus 100. Note that the unit of a shear modulus is Pa as well. However, all numerical values described as elastic moduli in the following description are Young's moduli. Since the elastic modulus of the bonding member 130 is small, the force generated by the difference between the linear expansion coefficient of the photo device 110 and that of the substrate 200 can be absorbed by the deformation of the bonding member 130, and warping of the transparent plate 150 can be suppressed. In some embodiments, the bonding member 130 having an elastic modulus of 1 GPa or less is used. When the bonding member 130 having an elastic modulus more than 1 GPa is used, the magnitude of warping per 1 mm in the photo device 110 can hardly be 2 μm or less, as described above. When a bonding member having an elastic modulus of 2 GPa is used for the sake of comparison in place of the bonding member 130 according to this embodiment, an obvious deterioration is observed in the performance of the optical apparatus 100. The elastic modulus of the bonding member 130 may be 0.5 GPa or less (for example, 500 MPa or less). For example, an example of the adhesive 131 that becomes the bonding member 130 after curing is a bismaleimide resin in which a filler of PTFE (polytetrafluoroethylene) is dispersed within the range of 35 wt % (inclusive) to 45 wt % (inclusive). In this case, the elastic modulus of the bonding member 130 is 300 MPa. Even when an epoxy resin, acrylic resin, polyethylene resin, or silicone resin is used, the elastic modulus of the bonding member 130 can be set to 1 GPa or less. However, the material or amount of a filler may be adjusted to set the elastic modulus of the resins described here to 1 GPa or less. For example, the elastic modulus of the epoxy resin or acrylic resin can be set to 2 to 3 GPa or 1 GPa or less by adjusting the material or amount of the filler. This also applies to the other resin materials. The filler may be a resin. A resin paste containing a metal filler such as Ag (silver) can hardly have an elastic modulus of 1 GPa or less. When the elastic modulus of the bonding member 130 is too low, the position of the photo device 110 shifts at a high possibility when curing the sealant 161 shown in FIG. 2E. To prevent this, in some embodiments, the bonding member 130 having an elastic modulus of 0.05 GPa or more is used. The elastic modulus of the bonding member 130 may be 0.1 GPa or more (for example, 100 MPa or more).

In some embodiments, the adhesive 131 having a low curing temperature is used. When the adhesive 131 that cures at a low temperature is used, the substrate 200 and the photo device 110 can be bonded in a state in which their expansion amounts are small. Hence, the force generated between the substrate 200 and the photo device 110 after cooling also becomes small. The curing temperature of the adhesive 131 may be equal to or less than the glass-transition point of the substrate 200. The adhesive 131 may be cured at a temperature equal to or less than the glass-transition point of the substrate 200. A typical material used for the substrate 200 increases the linear expansion coefficient along with an increase in the temperature. As compared to a linear expansion coefficient (α1) in a temperature range equal to or less than a glass-transition point Tg, a linear expansion coefficient (α2) in a temperature range more than the glass-transition point has a higher degree (slope) of increase of the linear expansion coefficient with respect to the temperature. For this reason, when the temperature exceeds the glass-transition point of the substrate 200 upon heating for curing the adhesive 131, the linear expansion coefficient of the substrate 200 increases largely, for example, to four to five times larger than in heating to a temperature equal to or less than the glass-transition point. As a result, the substrate 200 that is largely expanded is bonded to the photo device 110. A large force acts after cooling, and the substrate 200 largely warps. This phenomenon is conspicuous when the material of the substrate 200 is a resin. Since the glass-transition point of the resin substrate used for the optical apparatus 100 is, for example, 150° C. to 180° C., the adhesive 131 having a curing temperature of, for example, 80° C. (inclusive) to 150° C. (inclusive) is used. The curing temperature of the adhesive 131 can be lower than the glass-transition point of the bonding member 130 obtained by curing the adhesive 131 but may be higher. This is because the elastic modulus of the bonding member 130 is 1 GPa or less, and even in a temperature range higher than the glass-transition point of the bonding member 130, the influence of thermal expansion of the bonding member 130 can be reduced. The glass-transition point of the adhesive 131 may be room temperature or less or 0° C. or less. The adhesive 131 containing the above-described bismaleimide resin has a glass-transition point of about −30° C.

In some embodiments, the thin photo device 110 is prepared in the step of FIG. 2A. As the thickness of the photo device 110, for example, an average of the thicknesses of a plurality of portions is employed. The plurality of portions are, for example, portions corresponding to 3×3=9 intersections between three vertical lines and three horizontal lines, which equally divide the vertical and horizontal sizes into four parts. This also applies to the thicknesses of other components to be described below.

Figure 1:
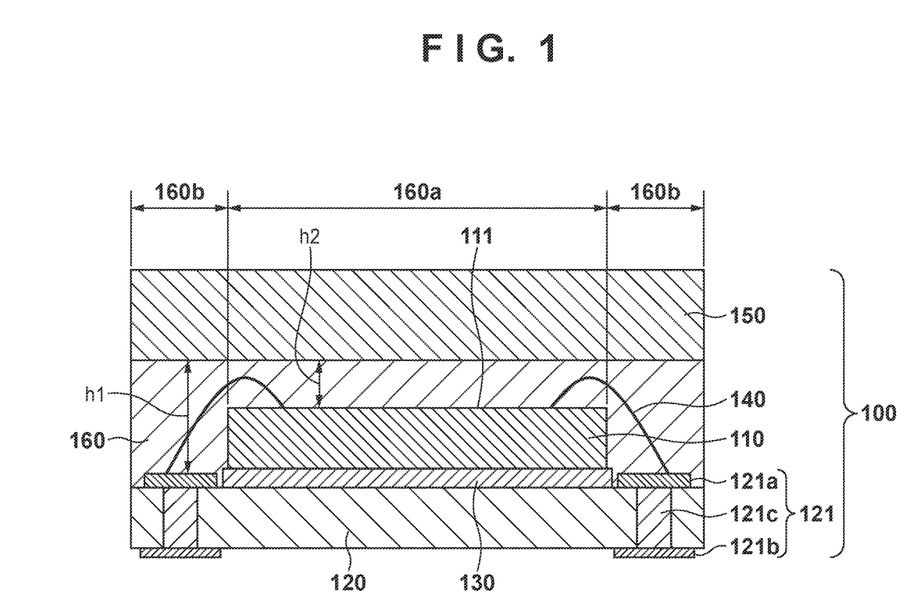
FIG. 1 is a schematic sectional view for explaining an example of the arrangement of an optical apparatus according to some embodiments.

As shown in FIG. 1, a portion that covers the photo device 110 out of the sealing member 160 will be referred to as a first portion 160a, and a portion other than the first portion 160a of the sealing member 160 will be referred to as a second portion 160b. The second portion 160b covers the upper surfaces of the substrate 120 and the inner portions 121a of the terminals 121. When the upper surface of the photo device 110 is rectangular, the first portion 160a forms a rectangular column, and the second portion 160b forms a rectangular tube. As shown in FIG. 1, let h1 be the thickness of the first portion 160a, and h2 be the thickness of the second portion 160b.

The smaller the difference between the thickness h1 of the first portion 160a and the thickness h2 of the second portion 160b is, the smaller the difference between the amount of shrinkage of the first portion 160a and that of the second portion 160b caused by curing of the sealing member 160 is. As a result, warping of the transparent plate 150 caused by a force generated with respect to the photo device 110 as the fulcrum becomes small. Hence, use of the thin photo device 110 makes it possible to reduce the difference between the thicknesses h1 and h2 and suppress warping of the transparent plate 150. On the other hand, if the photo device 110 is too thin, the difficulty in processing the photo device 110 increases, and the yield lowers. Hence, in the step of FIG. 2A, the photo device 110 having a thickness of, for example, 0.2 mm (inclusive) to 0.3 mm (inclusive) is prepared. The typical photo device 110 is made of a plurality of materials having different linear expansion coefficients. However, the linear expansion coefficient of the photo device 110 can be approximated by the linear expansion coefficient of a material that occupies 50% or more of the volume of the photo device 110. For example, in the photo device 110 including a 0.01-mm thick silicon oxide film and a 0.01-mm thick resin film formed on a 0.2-mm thick silicon substrate, the linear expansion coefficient of silicon can be regarded as the linear expansion coefficient of the photo device 110.

In some embodiments, to suppress warping of the transparent plate 150 caused by the shrinkage amount difference between the first portion 160a and the second portion 160b of the sealing member 160, the width of the second portion 160b of the sealing member 160 is narrowed. This can weaken the force received by the transparent plate 150 due to shrinkage of the second portion 160b and suppress warping of the transparent plate 150. The width of the second portion 160b corresponds to the distance from the edge of the photo device 110 to the edge of the substrate 120. The width of the second portion 160b is set to 2.5 mm or less. To do this, the photo devices 110 are arranged at an interval of 5.0 mm or less. If the width of the second portion 160b is too narrow, the interval between the adjacent photo devices 110 becomes narrow, the space between the photo devices 110 cannot sufficiently be filled with the sealant 161, and a gap may be formed in the step of FIG. 2D. This lowers the strength of the optical apparatus 100. To prevent this, the interval between the photo devices 110 may be set to 0.5 mm or more. The space having a width of 0.5 mm formed between the photo devices 110 is sufficiently wide to form the bonding wires 140. When the photo devices 110 are cut at the midpoint between them, the width of the second portion 160b is 0.25 mm or more. That is, in some embodiments, the photo devices 110 are arranged on the substrate 200 at an interval of 0.50 to 5.0 mm in the step of FIG. 2B. When cutting is performed in the step of FIG. 2F, the width of the second portion 160b is 0.25 mm (inclusive) to 2.5 mm (inclusive). For example, when the long side of the upper surface of the photo device 110 hash a length of 5 to 20 mm, and the short side has a length of 2.5 to 10 mm, the above-described arrangement and cutting are done such that the long side of the upper surface of the substrate 120 has a length of 6 mm to 30 mm, and the short side has a length of 3.5 to 30 mm. More specifically, when the long side of the upper surface of the photo device 110 has a length of 11.6 mm, and the short side has a length of 6.4 mm, the above-described arrangement and cutting may be done such that the long side of the upper surface of the substrate 120 has a length of 13.6 mm, and the short side has a length of 9.3 mm.

In some embodiments, the substrate 200 having a low rigidity (i.e. stiffness) is prepared in the step of FIG. 2A. The lower the rigidity of the substrate 200 is, the smaller the warping of the transparent plate 150 caused by warping of the substrate 200 is. In addition, when the rigidity of the substrate 200 is low, a force generated by volume shrinkage of the sealing member 160 is absorbed by deformation of the substrate 200, and a force applied to the transparent plate 150 can be suppressed. Generally, the rigidity of an object is known to be given by (elastic modulus of object)×(thickness of object)$^3$. In some embodiments, letting Es (GPa) be the elastic modulus of the substrate 200, and Ts (mm) be the thickness of the substrate 200, the substrate 200 satisfying $(Es)\times(Ts)^3 \leq 2.5$ is prepared in the step of FIG. 2A. If the substrate 200 is too thin, the workability degrades, and the yield lowers. The substrate 200 having a thickness of 0.2 mm or more may be prepared. For example, the substrate 200 formed from a glass epoxy or BT resin having an elastic modulus of 20 to 40 GPa and having a thickness of 0.3 to 0.5 mm is prepared.

In some embodiments, the substrate 200 having a small linear expansion coefficient is prepared in the step of FIG. 2A. As described with reference to FIG. 3A, warping of the photo device 110 and the substrate 200 is derived from the difference between the linear expansion coefficient of the photo device 110 and that of the substrate 200. The linear expansion coefficient of the photo device 110 is, for example, 1 to 5 ppm/° C. When the material of the photo device 110 is silicon, the linear expansion coefficient is 2.6 ppm/° C. When the linear expansion coefficient of the substrate 200 is made close to that of the photo device 110, warping of the transparent plate 150 can be suppressed. The linear expansion coefficient of the substrate 200 may be larger than that of the photo device 110. As the material of the substrate 200, a resin having a linear expansion coefficient of 5 to 50 ppm/° C. is usable. In some embodiments, a resin having a linear expansion coefficient of 20 ppm/° C. is used as the material of the substrate 200. In some embodiments, a resin having a linear expansion coefficient of 15 ppm/° C. is used as the material of the substrate 200.

In some embodiments, the transparent plate 230 having a high rigidity (i.e. stiffness) is prepared in the step of FIG. 2D. In some embodiments, a material having a high elastic modulus is used as the transparent plate 230. This can suppress warping of the transparent plate 230. The elastic modulus of the transparent plate 230 may be higher than that of the substrate 200. This makes it possible to cause the substrate 200 that readily deforms as compared to the transparent plate 230 having a light incident surface to absorb the internal stress of the optical apparatus 100 and suppress warping of the light incident surface. For example, letting Et (GPa) be the elastic modulus of the transparent plate 230, and Tt (mm) be the thickness of the transparent plate 230, a material satisfying $(Et)\times(Tt)^3 \geq 9$ is used. Therefore, the transparent plate 230 may have a higher rigidity than the substrate 200, and $(Es)\times(Ts)^3 < (Et)\times(Tt)^3$ may be satisfied. Examples of the material are borosilicate glass, IR-cut glass, quartz, and lithium niobate. For example, a borosilicate glass plate having a thickness of 0.5 mm has an elastic modulus of 70 GPa. When the transparent plate 230 is thick, the size of the optical apparatus 100 is large. Hence, the thickness of the transparent plate 230 is set to 1.5 mm or less. In addition, the linear expansion coefficient of the transparent plate 230 can be 1 to 10 ppm/° C., for example, 3.8 ppm/° C. When the substrate 200 which has a higher linear expansion coefficient than that of the transparent plate 230 and the photo device 110 is used, using the bonding member 130 having the elastic modulus of 1 GPa or less shows significant decrease of a warping of the substrate 200.

In some embodiments, the elastic modulus of the sealing member 160 is 0.01 GPa or less. Employing such a soft sealing member 160 is effective in relaxing the stress between the transparent plate 230 and the substrate 200. In some embodiments, the cure shrinkage ratio of the sealing member 160 is 2% (inclusive) to 5% (inclusive). The linear expansion coefficient of the sealing member 160 may be 80 to 320 ppm/° C., for example, 168 ppm/° C.

In some embodiments, the sealing member 160 is a UV curing resin. This can suppress warping caused by the expansion coefficient difference between the substrate 200 and the transparent plate 230 upon heating. To prevent the sealing member 160 from being distorted by abrupt curing shrinkage at the time of UV curing, weak UV irradiation of 200 mJ or less may be performed first, and strong UV irradiation may then be performed.

As described above, when at least one of the above-described methods is employed, and the above-described at least one condition is satisfied, warping of the transparent plate 150 of the optical apparatus 100 can be suppressed. For example, when the photo device 110 is an autofocus sensor, it is possible to suppress the positional shift of the photodiode in the photo device 110 and improve the distance measurement accuracy by suppressing warping of the transparent plate 150. For example, When the photo device 110 is a photo device (image sensor) for image capturing, it is possible to obtain a high quality image with small distortion by suppressing warping of the transparent plate 150.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of manufacturing an apparatus, comprising:
   arranging a plate and a photo-curing resin above a substrate so that the photo-curing resin is located between the plate and the substrate;
   forming a member by curing the photo-curing resin; and
   cutting the substrate and the plate after forming the member,
   wherein the curing of the photo-curing resin includes a first ultraviolet irradiation to the photo-curing resin via the plate and a second ultraviolet irradiation to the photo-curing resin via the plate after the first ultraviolet irradiation, and the second ultraviolet irradiation is stronger than the first ultraviolet irradiation.

2. The method according to claim 1, wherein the first ultraviolet irradiation is an ultraviolet irradiation of 200 mJ or less.

3. The method according to claim 1, wherein an elastic modulus of the plate is higher than an elastic modulus of the substrate, and a linear expansion coefficient of the substrate is higher than a linear expansion coefficient of the plate.

4. The method according to claim 1, wherein in the arranging of the plate and the photo-curing resin, after the plate is arranged above the substrate, the photo-curing resin is injected between the plate and the substrate.

5. The method according to claim 1, wherein letting Ts (mm) be a thickness of the substrate and Es (GPa) be an elastic modulus of the substrate, and letting Tt (mm) be a thickness of the plate and Et (GPa) be an elastic modulus of the plate, at least one of $(Es) \times (Ts)^3 < (Et) \times (Tt)^3$, $(Es) \times (Ts)^3 \leq 2.5$, or $(Et) \times (Tt)^3 \geq 9$ is satisfied.

6. The method according to claim 1, wherein a thickness of the plate is 1.5 mm or less, a thickness of the substrate is 0.2 mm or more, and a length of each side of the substrate before cutting is 200 mm or less.

7. The method according to claim 1, wherein a linear expansion coefficient of the substrate is 5 to 50 ppm/° C., a linear expansion coefficient of the plate is 1 to 10 ppm/° C., and a linear expansion coefficient of the member is 80 to 320 ppm/° C.

8. The method according to claim 1, wherein the cutting includes cutting the member.

9. The method according to claim 1, wherein the substrate is provided with a plurality of photo devices, and
   wherein a plurality of apparatuses, each of which includes corresponding one of the plurality of photo devices, are manufactured by the cutting.

10. The method according to claim 9, wherein each of the plurality of photo devices is bonded to the substrate by a member that has an elastic modulus of 1 GPa or less and is arranged between each of the plurality of photo devices and the substrate.

11. A method of manufacturing an apparatus, comprising:
    providing a substrate with a device electrically connected to the substrate;
    arranging a plate and a photo-curing resin above the substrate, so that the photo-curing resin and the device are located between the plate and the substrate; and
    forming a member by curing the photo-curing resin,
    wherein the curing of the photo-curing resin includes a first ultraviolet irradiation to the photo-curing resin via the plate and a second ultraviolet irradiation to the photo-curing resin via the plate after the first ultraviolet irradiation, and the second ultraviolet irradiation is stronger than the first ultraviolet irradiation.

12. The method according to claim 11, wherein the first ultraviolet irradiation is an ultraviolet irradiation of 200 mJ or less.

13. The method according to claim 11, wherein an elastic modulus of the plate is higher than an elastic modulus of the substrate, and a linear expansion coefficient of the substrate is higher than a linear expansion coefficient of the plate.

14. The method according to claim 11, wherein the providing of the substrate includes:
    arranging the device above the substrate so that a thermosetting resin is located between the device and the substrate; and
    bonding the substrate and the device by curing the thermosetting resin.

15. The method according to claim 11, wherein letting Ts (mm) be a thickness of the substrate and Es (GPa) be an elastic modulus of the substrate, and letting Tt (mm) be a thickness of the plate and Et (GPa) be an elastic modulus of the plate, at least one of $(Es) \times (Ts)^3 < (Et) \times (Tt)^3$, $(Es) \times (Ts)^3 \leq 2.5$, or $(Et) \times (Tt)^3 \geq 9$ is satisfied.

16. The method according to claim 11, wherein a thickness of the plate is 1.5 mm or less, a thickness of the substrate is 0.2 mm or more, and the device is bonded to the substrate by a member that has an elastic modulus of 1 GPa or less and is arranged between the device and the substrate.

17. The method according to claim 11, wherein the device is electrically connected to a terminal of the substrate by a wire, wherein the photo-curing resin touches the wire.

18. The method according to claim 11, wherein a linear expansion coefficient of the substrate is 5 to 50 ppm/° C., a linear expansion coefficient of the plate is 1 to 10 ppm/° C., and a linear expansion coefficient of the member is 80 to 320 ppm/° C.

19. The method according to claim 11, wherein the member includes a first portion arranged between the device and the plate and a second portion arranged between the substrate and the plate, and a thickness of the first portion is smaller than a thickness of the second portion.

20. The method according to claim 11, wherein the device is a sensor.

* * * * *